Sept. 7, 1965 B. D. BROCK 3,205,297

ELECTRICAL CONNECTION UTILIZING TAMPED GOLD FOIL

Filed Aug. 3, 1962

BERT D. BROCK
INVENTOR.

BY Gerald Singer
George C. Thompson Jr.
AGENTS 3,205,297
ELECTRICAL CONNECTION UTILIZING TAMPED GOLD FOIL Bert D. Brock, Gardena, Calif., assignor, by mesne assignments, to Thompson Ramo Wooldridge Inc., Cleveland, Ohio, a corporation of Ohio Filed Aug. 3, 1962, Ser. No. 214,629
4 Claims. (Cl. 174—68.5)

This invention relates to microelectronic connections and more particularly to improved electrical and mechanical connections using gold foil.

In the microminiature electronic design art there are numerous problems associated with the making of satisfactory electrical connections. As the size of electronic parts tends to become progressively smaller, the amount of wiring in sophisticated electronic equipment becomes proportionately greater, and the probability of connection failures and bulk of interconnecting wiring place practical ceilings on microminiature equipment design. It can be shown that the number of interconnections increases at a rate greater than the number of modules being connected.

The extremely small size of electronic parts and lead wires complicates the connection problem. Conventional methods and techniques for making electrical connections are difficult or impractical in many instances. In this invention, a method and technique are disclosed in which gold foil is located around a conductive lead located within a gold plated insert. The gold foil is tamped, thereby creating a metallurgical cold-welded mass. The tamped gold foil technique is particularly adaptable to solving the connection problems of microminiature equipment since the gold foil can be worked at room temperature without additional temperature.

Further objects and advantages of the present invention will be made more apparent by referring now to the accompanying drawing wherein.

In this invention the use of pure gold foil as a bonding agent in effecting microelectronic connections is disclosed. The use of tamped pure gold foil is well known to the dentistry art but is rarely used. Its application to microelectronic connection is considered novel. Evaluation shows that connections prepared according to the teachings of this invention produce metallic bonds having mechanical tensile strength and electrical resistance characteristics comparing favorably with ordinary hot soldering or resistance welding methods.

The particular embodiment chosen to evaluate the invention was made by connecting small gage electronic wire leads to a substrate material. As electronic parts are progressively miniaturized, the wire leads become smaller so that many microminiature parts now have leads with the diameter of fine hairs. Damage to the parts or the wires may occur by exposure to heat which is inherent in hot soldering and, to a lesser degree, in resistance welding connection methods.

Gold, due to its high ductility, inert chemical nature, and the resultant absence of surface films is readily worked plastically to form a solid cold-welded mass. If wires and substrate circuit board surfaces are gold plated, a metallurgical bond can be made between the pieces to be joined by tamping pure gold foil around them.

Figure 1:
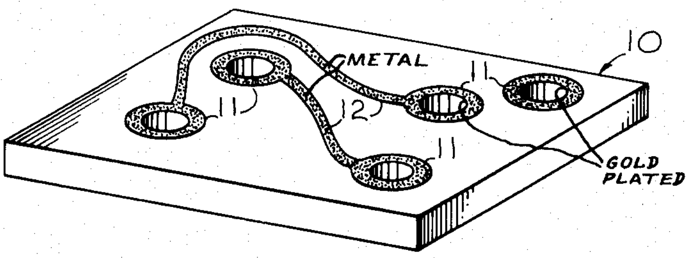
FIG. 1 illustrates a terminal board having a plurality of electrically connected eyelets.

Referring now to FIG. 1 there is shown a terminal board 10 having a plurality of gold plated inserts 11, each located in a hole in the terminal board. The individual inserts 11 are shown being interconnected by suitably conductive members 12 as determined by the electronics of the over-all system. In one of the embodiments tested the terminal board 10 was an epoxy-glass printed circuit board 0.031 inch thick having plated through holes. The plating in the holes was copper, approximately 0.002 inch thick and the hole diameter was .070 inch. In this invention the term insert refers to the technique of through plating as described above or to the use of a separate eyelet material which is subsequently plated.

Figure 2:
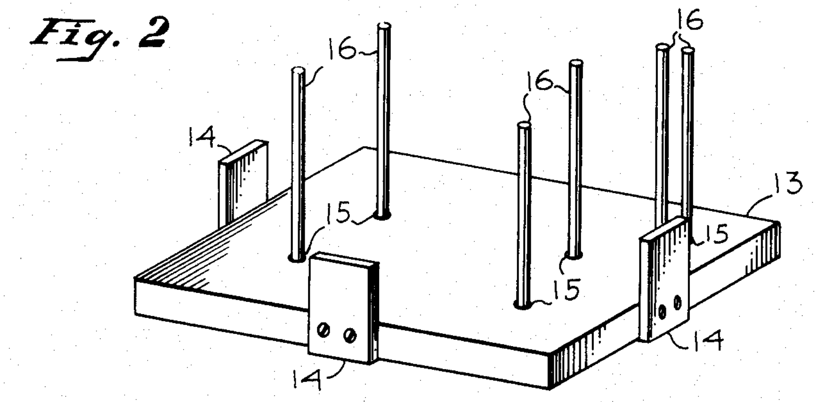
FIG. 2 illustrates a substrate material for holding a plurality of wires.
Figure 3:
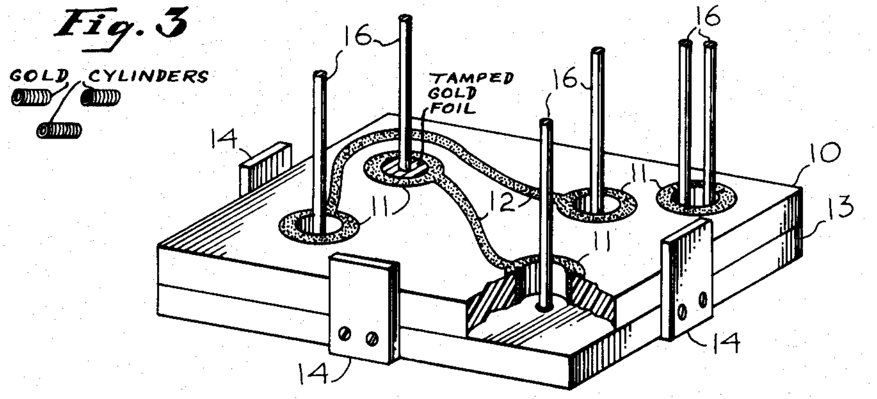
FIG. 3 illustrates a method of indexing the substrate of FIG. 2 with the terminal board of FIG. 1 prior to inserting the gold filling.

Referring now to FIG. 2 there is shown a substrate having a plurality of registration guides 14 for locating the terminal board 10 of FIG. 1. The substrate 13 contains a plurality of holes 15 of sufficient size to accept and hold wires 16. FIG. 3 illustrates how the terminal board 10 of FIG. 1 is mounted on the top of the substrate 13 of FIG. 2 with the wires 16 projecting through the gold plated inserts 11.

The bonding of the wire 16 to the insert 11 may be achieved by initially placing approximately four gold foil cylinders around the wire 16. The gold used in the preferred embodiment was a high purity, fully annealed foil or sheet. This gold is commercially obtainable from dental supply houses, wadded into what are known as pure gold cylinders. Different sizes are available and typically they are ⅛ inch in diameter, $\frac{3}{16}$ inch long, and weigh approximately five milligrams each. It was found desirable to use tweezers in placing the gold cylinders about the wire 16 in the insert 11. The gold cylinders are then tamped in place until it becomes hard to the touch and assumes a bright, shiny appearance. The tamping process is facilitated by using an automatic dental hand mallet and plunger which is a commercially available dental hand instrument.

In the tamping instrument used, the tip of the plunger is a punch with a diameter of approximately 0.02 inch which is set into the mallet. The mallet itself is simply a handle with a trip hammer arrangement which slips under a hand pressure of approximately two pounds. This results in a tampering pressure of approximately 6300 pounds per square inch over the affected area. Other dental type tamping tools are available which operate on compressed air or mechanical power. The hand tamping of a gold electrical connection, as described, requires approximately two to three minutes.

Photomicrographs of a typical tamped gold electrical connection cross section show that a solid metallic bond is formed. Tensile testing of samples of connections made with tamped pure gold foil was performed to determine the mechanical strength of electrical connections. The printed circuit board was held firmly while an axial load was applied to the wire which was connected to a plated-through hole in the board. The number of pounds required to break the bond was measured, using a mechanical force gage and tabulated as follows:

*Table*

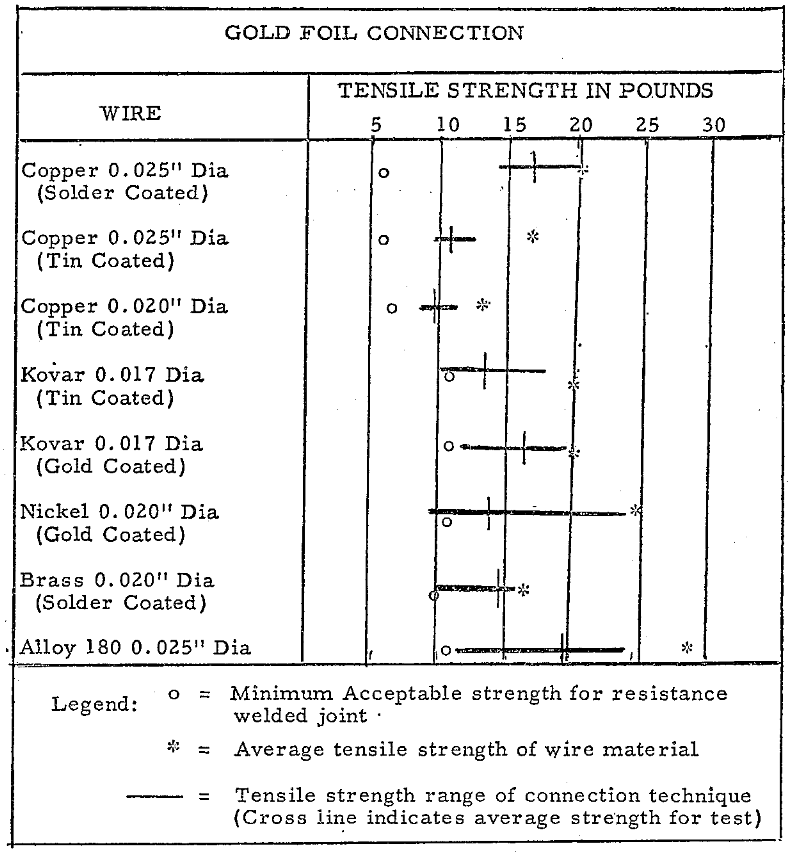

The result of the test shows that in all instances the mechanical tensile strength of the gold sample was satisfactory, ranging generally between the minimum acceptable strength for a welded connection and the average tensile strength of the wire. In one instance the strength of the gold connections was below the minimum welded strength. For connection of microminiature electronic parts, however, the strength values were considered fully adequate for the purpose. The results of an electrical test showed that the tamped pure gold foil connection has a lower resistivity and greater uniformity than the soldering method commonly used for electrical connections, thereby providing improved electrical characteristics. The tamped gold foil technique produced metallurgically sound joints with acceptable strength characteristics and favorable electrical resistance. The advantage can be summarized as follows:

(1) No weighing or mixing of components involving associated process controls.

(2) No pot life or shelf life limitations.

(3) No curing time necessary.

(4) No corrosion or compatibility problems occur with pure gold due to its inert chemical nature.

(5) The welding process is achieved without the application of external heat.

Accordingly, it is desired that this invention not be limited to the particular details of the embodiments disclosed except as defined by the appended claims.

The embodiments of the invention in which an exclusive property or privilege is claimed are defined as follows:

1. In combination:

a gold plated electrically conductive insert, an electrically conductive lead located within said insert, and a tamped gold filling surrounding said lead and filling said insert and being cold welded to said lead and said insert thereby effecting a solid cold-welded mass therebetween.

2. A combination according to claim 1 in which said electrically conductive lead is gold plated.

3. In combination:

an insulated circuit board having an opening, a gold plated electrically conductive insert mounted in said opening, said insert serving as terminal connections for electrical components mounted on said circuit board, an electrically conductive lead located within said insert, and a tamped gold filling within the insert and surrounding said lead and cold welded to the lead and insert for effecting a solid cold-welded mass therebetween.

4. The combination of claim 3 wherein said gold filling comprises a cylindrically formed gold foil disposed about said lead.

References Cited by the Examiner

UNITED STATES PATENTS

| | | | |
|---|---|---|---|
| 1,770,825 | 7/30 | Adams et al. | 310—249 |
| 3,040,119 | 6/62 | Granzon | 174—68.5 |
| 3,110,089 | 11/63 | Hill | 29—155.55 |

DARRELL L. CLAY, *Acting Primary Examiner.*

JOHN P. WILDMAN, JOHN F. BURNS, *Examiners.*